Jan. 28, 1969 D. N. SITTER 3,424,908

AMPLIFIER FOR PHOTOCELL

Filed Oct. 19, 1966

INVENTOR.
DAVID N. SITTER

BY Stanley C Corwin

HIS ATTORNEY 3,424,908
AMPLIFIER FOR PHOTOCELL
David N. Sitter, Waynesboro, Va., assignor to General Electric Company, a corporation of New York
Filed Oct. 19, 1966, Ser. No. 587,836
U.S. Cl. 250—206 4 Claims
Int. Cl. H01j 39/12

This invention relates to an amplifier for a photocell and more specifically to an amplifier for operating a photovoltaic cell in the current mode.

Practical utilization of the photovoltaic cell requires considerable amplification of the low current generated by the cell in response to light impinging thereon. In the past, this has resulted in coupling the photovoltaic cell to a high gain amplifier to produce a usable output. A typical amplifier finds the photovoltaic cell coupled to the circuit input where not only the variations in current output from the cell, but also background noise and leakage current are often amplified to provide undiscernible output signals.

Such unfavorable results are somewhat compensated for by negative feedback which is added to control the gain of the circuit, insuring that the gain of the individual stages are independent of the particular components used. This feedback, however, adds to circuit complexity and sacrifices the high gain necessary for utilization of the photocell output.

It is accordingly an object of the present invention to provide an amplifier for a photovoltaic cell that isolates variations in cell current from other undesired signals and amplifies only the cell output.

The photovoltaic cell provides an indication of light intensity by the voltage it develops and by the current it generates. It has been observed that within a given range cell current is a linear function of light intensity. This range of linear relationship between light and cell current, however, can be adversely affected by the electrical load across the cell. Because the voltage output of a photovoltaic cell is limited, the size of the resistor that can be placed across the cell to develop a voltage proportional to cell current is limited. In other words, cell current is proportional to light intensity so long as the voltage capability of the cell is not exceeded.

It is accordingly an object of the present invention to provide an amplifier for operating a photovoltaic cell in the current mode.

Another object is to provide an amplifier for a photovoltaic cell that includes an impedance converter to maintain a low resistance across the cell.

A further object of the invention is to provide an amplifier for a photovoltaic cell that utilizes impedance conversion instead of current gain to obtain a usable cell output.

Other objects and advantages of the invention will become more apparent from the following detailed description taken in connection with the drawings, in which—

Figure 1:
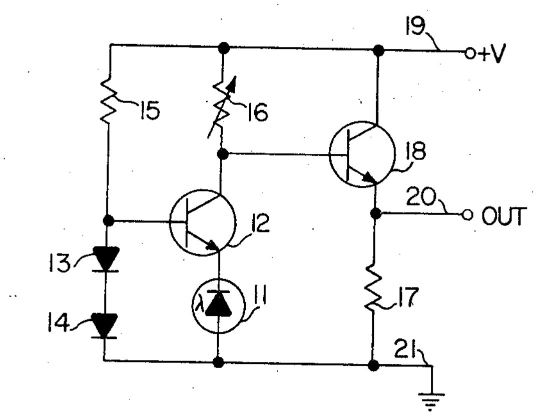
Figure 2:
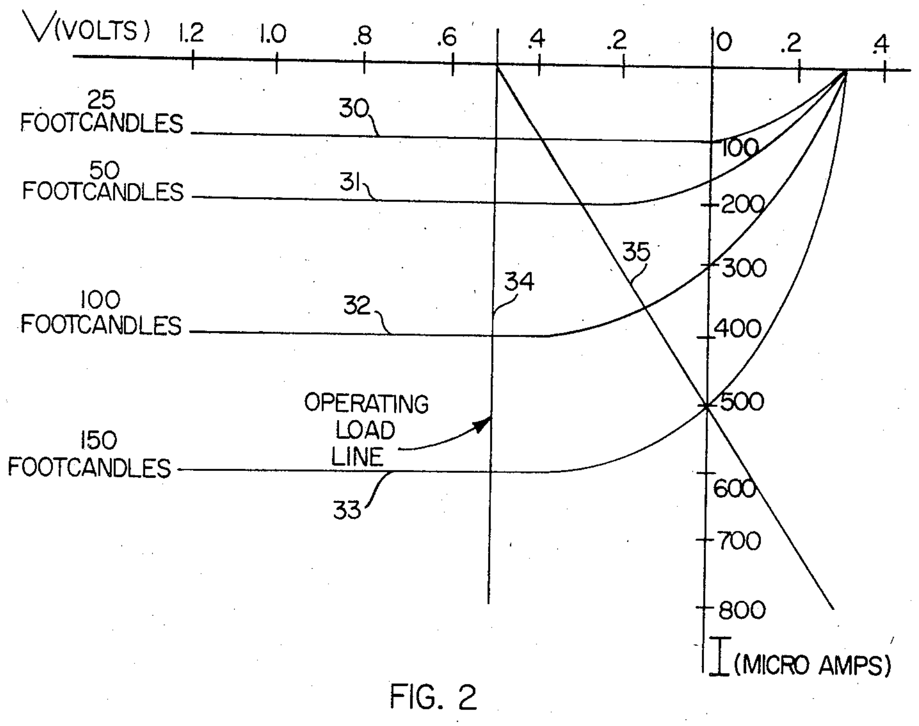

FIGURE 1 is a circuit diagram of an amplifier for a photovoltaic cell according to the invention, and FIGURE 2 is a graph illustrating the current-voltage characteristics of a photovoltaic cell.

FIGURE 1 shows a photovoltaic cell 11 connected at its cathode to the emitter of an NPN transistor 12 and at its anode to the ground lead 21. Since a photovoltaic cell generates a current which flows out of the anode, the current flowing through the collector-emitter path of the transistor is in the direction indicated by the emitter arrow. Diodes 13 and 14 are shown connected in series and coupled across the photovoltaic cell by the emitter base diode of transistor 12. These diodes together with resistor 15, which couples a positive voltage at conductor 19 to the anode of diode 13, serve both to forward bias transistor 12 and to reverse bias the photovoltaic cell 11. The diodes provide a negative bias of approximately one-half volt across the cell.

Variable resistor 16 couples the collector of transistor 12 to the source of positive voltage at bus 19 completing the first stage of the amplifier. The cell current passing through variable resisitor 16 develops a voltage thereacross so that the voltage across resistor 16 is a direct indication of the intensity of the light impinging on the photovoltaic cell. By adjusting the value of resistor 16, the magnitude of the voltage across the resistor and the effective gain of this amplifier stage is controlled.

As shown in FIGURE 1, transistor 12 is operating in the common base configuration. Therefore, the current that is generated by the cell 11 in the emitter circuit is coupled by the transistor with substantially unity gain to resistor 16 in its collector circuit. Since the base or normal input to transistor 12 serves only to couple a bias across the photocell, external signals appearing at this lead will merely add to or subtract from the bias. This is in contrast to circuits of the prior art where the photocell is coupled to the base of the transistor and external signals are added to the cell output and amplified. By observing FIGURE 2, it is noted that a slight change in the bias will not affect the cell current since cell current is constant in the range of the bias afforded by diodes 13 and 14.

The second stage of the amplifier shown in FIGURE 1 is an emitter-follower which provides the current gain necessary for practical utilization of the output of the first stage. The base of transistor 18 is connected directly to the collector of transistor 12 so that the voltage at the collector of transistor 12 is coupled across the emitter resistor 17 of transistor 18 where it appears as a usable voltage output for the circuit at terminal 20.

FIGURE 2 shows a plot of current versus voltage for a photovoltaic cell exposed to different intensities. Curves 30 to 33 indicate the response of the photocell to various light intensities ranging from 25 footcandles to 150 footcandles. Line 34 is a constant voltage line from the —0.5 volt point, indicating the negative bias placed across the photovoltaic cell 11 by diodes 13 and 14 in the circuit of FIGURE 1. This line is the operating load line for cell 11 and it is noted that it intersects the response curves 30–33 at points where the current is constant. It can thus be said that in this operating range the current generated by the cell is a linear function of light intensity. More specifically, for each footcandle of light intensity, the graph shows that 4 microamps of cell current is generated.

Because a photovoltaic cell is limited in its voltage generating capabilities, it must supply a low impedance in order to generate maximum current for the light received. This is shown in FIGURE 2. While load line 34 is vertical due to the very low (15 to 35 ohms) input impedance of transistor 12 operating in the common base configuration, line 35 represents the load line of a 1,000 ohm resistor coupled across photocell 11. It is noted that if the cell is exposed to a 100 footcandle light source, 400 microamps of the current can be generated. However, when a 1000 ohm load is placed across the cell only 360 microamps is generated for 100 footcandles. Thus, it can be said that cell current falls off and is a nonlinear function of light intensity as the resistance across the cell increases beyond the cell's capability of generating voltage necessary to support the current.

Because the photovoltaic cell must operate into a low impedance, transistor 12 in FIGURE 1 insures that the cell generates maximum current that is a linear function of light intensity by isolating the cell 11 from the effects of the extremely large load resistor 16. This transistor provides no gain and acts only as a buffer or impedance converter.

It should be pointed out that there are many variations to the circuit shown in FIGURE 1. While NPN transistors have been shown, PNP transistors could readily be substituted or any combination of NPN or PNP transistors. While a two-stage amplifier is shown, if it were possible in a given application to utilize the voltage across resistor 16 without loading down the amplifier, an output might be directly obtained from the first stage. In the case where large loads are experienced, several stages of amplification may be necessary.

It should also be noted that while a particular bias circuit consisting of resistor 15 and diodes 13 and 14 is shown in FIGURE 1, other bias configurations are possible. For example, the diodes 13 and 14 could be supplanted by a battery of the appropriate voltage rating or, in fact, by a resistor of a size determined by the current drawn by transistor 12 and also by the size of resistor 15. The circuit of FIGURE 1 is thus merely a preferred embodiment of the invention which is the use of a transistor as an impedance converter rather than a current amplifier to operate a photovoltaic cell in the current mode and obtain a linear indication of light intensity.

What is claimed and desired to be secured by Letters Patent of the United States is:

1. An amplifier for a photocell comprising a transistor having its emitter coupled to said photocell, bias means coupled to the base of said transistor to forward bias said transistor and reverse bias said photocell, and a resistor coupled to the collector of said transistor and forming a series circuit with said transistor, said photocell and the direct voltage source coupled thereto during operation, said resistor receiving the current generated by said photocell in response to light impinging thereon and developing a voltage proportional to the cell current and having a magnitude determined by the size of said resistor.

2. An amplifier for operating a photovoltaic cell in the current mode comprising a transistor having its emitter coupled to said photovoltaic cell, bias means coupled to the base of said transistor and across said photovoltaic cell to forward bias said transistor and reverse bias said cell into the range where cell current is a linear function of the light impinging thereon, and a resistor coupled to the collector of said transistor to receive said cell current and develop a voltage thereacross proportional to said cell current and having a magnitude determined by the size of said resistor, said photovoltaic cell, transistor and resistor forming a series circuit with the direct voltage source applied thereacross during operation.

3. An amplifier as recited in claim 2 wherein said bias means develops a constant voltage across said photovoltaic cell.

4. An amplifier as recited in claim 3 wherein said bias means includes one or more diodes coupled across said photovoltaic cell and oriented to develop a voltage of opposite polarity to the voltage generated by said photovoltaic cell.

References Cited

UNITED STATES PATENTS

| | | | |
|---|---|---|---|
| 3,137,794 | 6/1964 | Seward | 250—206 X |
| 3,157,843 | 11/1964 | Koncen | 250—206 X |
| 3,194,968 | 7/1965 | Masin | 307—311 X |
| 3,315,176 | 4/1967 | Biard | 307—311 X |

JAMES W. LAWRENCE, *Primary Examiner.*

C. R. CAMPBELL, *Assistant Examiner.*

U.S. Cl. X.R.

250—211, 212; 307—311